United States Patent
Kamisuwa

(10) Patent No.: US 6,498,339 B1
(45) Date of Patent: Dec. 24, 2002

(54) DISPLACEMENT DIAGNOSING METHOD APPLIED TO AN IMAGE READ-OUT APPARATUS

(75) Inventor: Yoshikatsu Kamisuwa, Kawasaki (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 37 days.

(21) Appl. No.: 09/597,617

(22) Filed: Jun. 20, 2000

(30) Foreign Application Priority Data

Jun. 21, 1999 (JP) .......................................... 11-174067

(51) Int. Cl.[7] ................................................ H01J 40/14
(52) U.S. Cl. .................................. 250/234; 250/559.39
(58) Field of Search ................................ 250/234, 235, 250/559.3, 559.4, 559.44, 559.39; 356/622; 358/482, 488; 359/201, 209

(56) References Cited

U.S. PATENT DOCUMENTS 5,359,434 A * 10/1994 Nakao et al. ............... 358/481
5,719,404 A * 2/1998 Tsai ......................... 250/559.29

* cited by examiner

Primary Examiner—Robert H. Kim
Assistant Examiner—Jurie Yun
(74) Attorney, Agent, or Firm—Foley & Lardner

(57) ABSTRACT

A scanner unit as an image read-out apparatus has a document glass on which a document is placed, an exposure lamp for illuminating the document with light, a CCD line sensor for receiving reflected flight from the document and converting the light to electric signal, first to third mirrors for conducing the reflected light from the document to the CCD sensor and a light condensing lens for allowing the reflected light which is conducted through the first to the third mirrors to condense on the CCD line sensor. In a position away from a document effective area at which the document is set on a document glass a chart is printed or attached to allow diagnosis to be made for the "displacements" of scanner unit's respective constituent elements, that is, optical members such as the exposure lamp, first to third mirrors, lens and CCD line sensor.

8 Claims, 5 Drawing Sheets

DISPLACEMENT DIAGNOSING METHOD APPLIED TO AN IMAGE READ-OUT APPARATUS

CROSS-REFERENCE TO RELATED APPLICATIONS

This application is based upon and claims the benefit of priority from the prior Japanese Patent Application No. 11-174067, filed Jun. 21, 1999, the entire contents of which are incorporated herein by reference.

BACKGROUND OF THE INVENTION

This invention relates to a method for making diagnosis for the displacements of respective constituent:elements in an image read-out apparatus and, in particular, a method for making self-diagnosis for a positional displacement and angle displacement of optical members such as mirrors and lens in a scanner section of a digital copier.

The digital copier includes a scanner section for reading out an image of a document and a printer section for copying the read-out image. The scanner section directs light onto a document placed on a document glass and receives reflected light and, after a conversion to an electric signal, obtains corresponding image data. The printer section allows a laser beam which is energized based on the obtained image data to be directed onto a read surface of a charged photosensitive drum to form an electrostatic latent image on the drum surface, develops the electrostatic latent image by a developing agent to a visible one, transfers it to a recording medium and outputs a corresponding image on the recording medium.

After the shipment of such a kind of digital copier, diagnosis is made, as a maintence and inspection operation, to see whether or not any displacement occurs in the respective constituent elements in the printer section and, by doing so, adjustment is made and another adjustment is also made by making diagnosis for the positional displacement of respective optical members in the scanner section.

First, based on a test-use image data initially prepared in the digital copier, a test image is output onto the recording medium through the printer section. At this time, the scanner section is not operated. And, by inspecting an output test image, the operator checks whether or not any displacement occurs in the respective: constituent elements in the printer section and manually adjusts the displacement of involved constituent elements.

After, in this way, any displacement of the constituent elements in the printer section has been adjusted, the operator places an adjustment-use chart on the document glass, reads out the chart through the scanner section and, based on the image data relating to the read-out chart, prints the test image on the recording medium through the printer section. And the operator checks the printed test image to make diagnosis for the distortion, displacement, etc., of the image and adjusts the involved optical members in the scanner section.

In the above-mentioned conventional method, even if, for example, the displacement only of the scanner section is to be adjusted, it is necessary to first adjust the printer section and it takes a long time and cumbersome operation for the operator to do adjustment. In this case, if the printer section is not accurately adjusted, any improper adjustment of the displacement at the printer section imparts an adverse influence to the adjustment of the scanner section, so that it is not possible to accurately adjust the scanner section.

Further, since, with respect to the adjustment of the scanner section, the test image is printed out with the test-use chart set on the document glass, it is necessary for the operator to manually set the chart on the document glass. It is not possible, therefore, to make automatic adjustment. Further, it is also necessary to prepare a plurality of kinds of test-use charts corresponding to the adjustment items and make test-printing. This takes a lot of time and labor.

Further, since diagnosis is made for the displacement of the scanner section by checking the printed-out test image by the eye of the operator, this evaluation differs from operator to operator, thus presenting a problem. In the case where the displacement of the scanner section is relatively small, the displacement and distortion of a test-printed image are small and their evaluation is sometimes difficult even if they are checked by the eye of the operator. In this case, the test-printed recording medium has sometimes to be copied and, by doing so, the displacement and distortion of the image is enlarged for the operator to evaluate them properly.

BRIEF SUMMARY OF THE INVENTION

This invention is achieved with the above-mentioned points in view and it is accordingly the object of the present invention to provide a displacement diagnosing method applied to an image pick-up apparatus which can make accurate diagnosis for the displacement of respective constituent elements in the image read-out apparatus, for a shorter time, and obtain a high reliable result of diagnosis.

In order to achieve the above-mentioned object of this invention there is provided a displacement diagnosing method applied to an image read-out apparatus having a light source for illuminating a document with light, an optical element for allowing light which is reflected from the document to be received and detecting a corresponding image signal, and a plurality of optical members for guiding the reflected light from the document to the optical element, the method comprising the steps of: directing light from the light source to a mark provided on a body of the image pick-up apparatus in a position adjacent to the document; guiding the reflected light to the optical element through the optical members to allow an image signal relating to the mark to be detected by the optical element; and, based on the detected image signal, making diagnosis for displacements of those constituent elements of the image read-out apparatus including the light source, optical members and optical element.

Further according to this invention there is provided a displacement diagnosing method applied to an image read-out apparatus having a light source for illuminating a document with light, an optical element for allowing light which is reflected from the document to be received and detecting a corresponding image signal and a plurality of optical members for guiding the reflected light from the document to the optical element, the method using a diagnosis chart provided on a body of the image read-out apparatus in a position adjacent to the document and including a first mark having line segment extending in a first direction along the document and line segments oblique to the first direction and a second mark having a plurality of sets of black/white pair lines extending in the first direction and arranged along a second direction perpendicular to the first direction and using a plurality of photoelectric conversion elements provided at the optical element and arranged along the second direction and comprising the steps of: directing the light from the light source to the chart; guiding the reflected light through the optical members to the photoelectric conversion elements in the optical element to detect an image signal relating to the first and second marks; and, based on the detected image signal, making diagnosis for the displacements of constituent elements of the image read-out apparatus including the light source, optical members and optical element.

Further according to this invention there is provided a displacement diagnosing/adjusting method applied to an image read-out apparatus having a light source for illuminating a document with light, an optical element for allowing light which is reflected from the document to be received and detecting a corresponding image signal and a plurality of optical members for guiding the reflected light from the document to the optical element, the method comprising the steps of: directing light from the light source onto a mark provided on a body of the image read-out apparatus in a position adjacent to the document; guiding the reflected light through the optical members to the optical element to detect an image signal relating to the mark; based on the detected image signal, making self-diagnosis, by the image read-out apparatus, for the displacements of constituent elements of the image read-out apparatus including the light source, optical members and optical element, and automatically adjusting the displacements of the constituents involved as a result of self-diagnosis.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of this invention will be explained in more detailed below with reference to the accompanying drawing.

First, a scanner unit 11 functioning as an image read-out apparatus of this invention will be explained below with reference to FIGS. 1 and 2. The scanner unit 11 of this embodiment is mounted on a digital copier, not shown, for copying a document image on a recording. sheet. In an explanation below, a main scanning direction is intended to mean a sheet surface direction of FIG. 1, that is, a direction extending from a front side to a rear side of the scanner unit 11 and a sub-scanning direction to mean a direction perpendicular to the main scanning direction, that is, a right/left direction of FIG. 1. Further, FIG. 1 is a view looking at the scanner 11 from its rear side.

Figure 1:
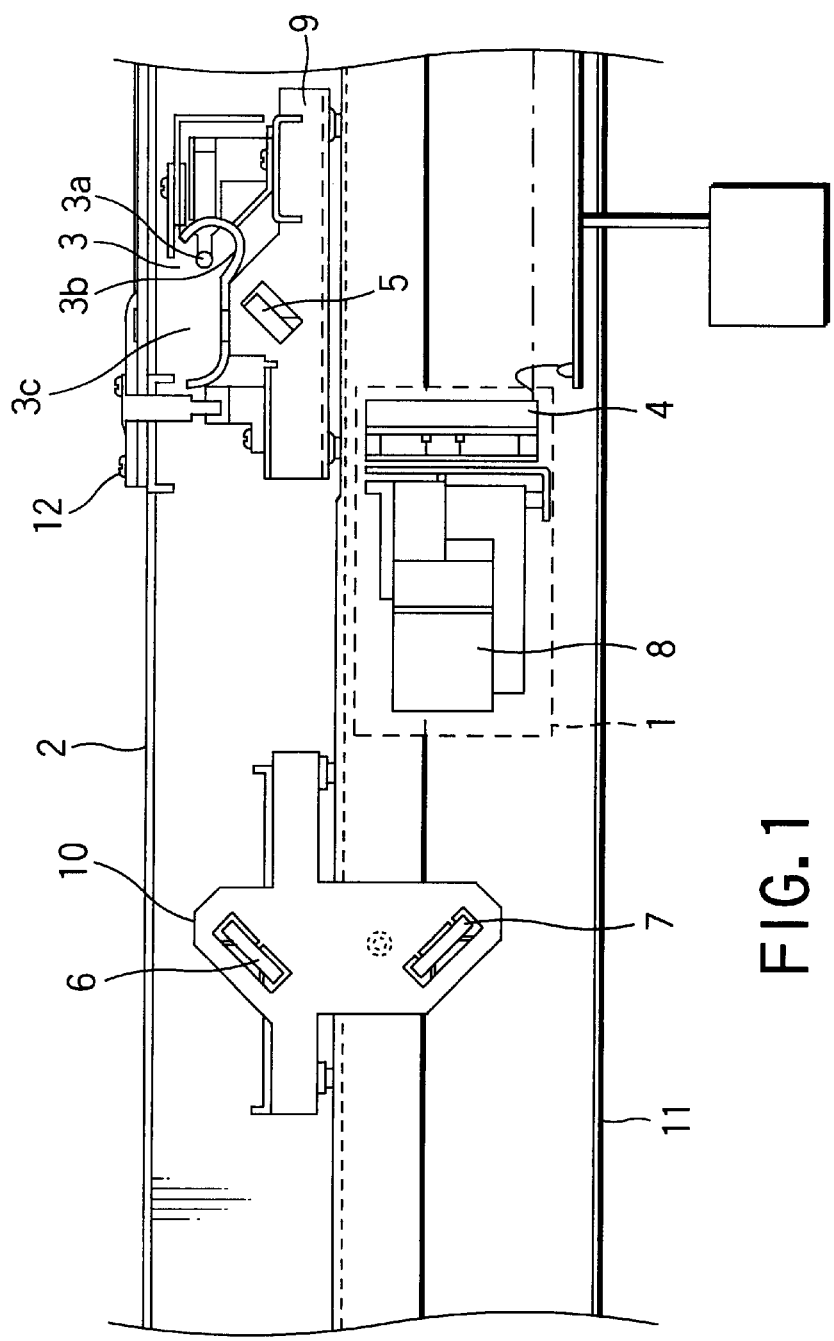
FIG. 1 is a view showing a major section of a scanner unit as an image read-out apparatus according to an embodiment of this invention.
Figure 2:
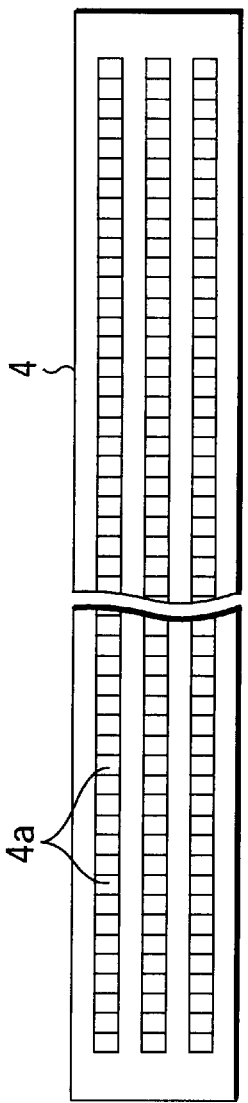
FIG. 2 is a view showing a major section of a line sensor incorporated into the scanner unit of FIG. 1.

As shown in FIG. 1, the scanner unit 11 has, at its top surface, a document glass 2 with a document (not shown) placed thereon as an object to be read out. Below the document glass 2 a light source unit 3 is so arranged as to have an exposure lamp 3a (light source) for illuminating a document on the document glass 2 from its under side and a reflector 3b for allowing light from the exposure lamp 3a to effectively focus at the document. The reflector 3b has a slit 3c extending in the main scanning direction to allow the light which is reflected from the document to be directed at a first mirror 5.

A CCD line sensor 4 (optical element) for allowing the photoelectric conversion of the reflected light is arranged on an optical path of the reflected light guided from the document via the slit 3c of the light source unit 3. The CCD line sensor 4 has a large number of photoelectric conversion elements 4a arranged along the main scanning direction as shown in FIG. 2. The CCD line sensor 4 receives the reflected light, through the photoelectric conversion elements 4a, which is guided from the document and obtains a plurality of image data corresponding to many pixels arranged on one scanning line along a main scanning direction of the document surface. And the CCD line sensor 4 outputs a plurality of image data which correspond to the respective pixels on one scanning line on the document surface as electric signals of those output levels corresponding to the concentration levels of these pixels.

Further, a scanner unit 11 has, as a plurality of optical members constituting an optical system guiding the reflected light from the document to the CCD line sensor 4, first, second and third mirrors 5, 6 and 7 as well as a lens 8 which allows the reflected light which is guided via these mirrors 5, 6 and 7 to be changed to "variable power" light and illuminated onto a plurality of photoelectric conversion elements 4a of the CCD line sensor 4.

The light source unit 3 and first mirror 5 are mounted on a first carriage 9. The second mirror 6 and third mirror 7 are mounted on a second carrier 10. In order to keep, constant, an optical path length of the light which is reflected from the document by being illuminated by the light source unit 3, that is, an optical path length of such reflected light leading to the CCD line sensor 4, the second carriage 10 is adapted to be moved along the sub-scanning direction at a ½ speed that of the first carriage 9.

The above-mentioned CCD line sensor 4 and lens 8 constitute an optical unit 1 mounted on the same substrate.

The lens 8 is arranged in a plane including an optical axis of light deflected by the third mirror 7 and allows the reflected light to be imaged at a desired power onto the CCD line sensor 4.

It is to be noted that the color CCD line sensor used for a color scanner for reading out a document image in color has, for example, photoelectric conversion element arrays corresponding to the three colors R (red), G (green) and B (blue) arranged in parallel to each other along the main scanning direction. The color CCD line sensor converts respective pixels on one scanning line along the main scanning direction on the document surface to electric signals for each color component of the colors R, G and B and output them.

A shading plate 12 is provided in a position adjacent to the document glass 2 on the moving start side of the first carriage 9, that is, in a position adjacent to the right side of the document glass 2 in FIG. 1 and extends in the main scanning direction. To the lower surface of the shading plate 12 a white paper sheet (not shown) is attached to give a white reference for the sensitivity adjustment of the CCD line sensor 4 and for the black/white level correction of the document. This white paper sheet serves as a reference plate for giving the reference for detection by the CCD line sensor 4.

In the scanner unit 11 thus arranged, an image corresponding to one line of the document surface along the main scanning direction is read out by the CCD line sensor 4 and a whole image of the document is read out by moving the first and second carriages 9 and 10 in the sub-scanning direction. It is to be noted that, in the present embodiment, use was made of the scanner unit 11 having a resolution of 600 dpi (one pixel size: 42 $\mu$m=42 $\mu$m) in both the main scanning direction and the sub-scanning direction.

Incidentally, on shipment of a digital copier with the scanner unit 11 mounted thereon or at a maintenance and inspection of it by an operator, diagnosis is made for the displacement and distortion of respective constituent elements including the light source unit 3, first to third mirrors 5 to 7, lens 8, CCD line sensor 4, etc., in the scanner unit 11 and adjusting operation is carried out to correct the displacement and distortion for which the diagnosis is made, and the mounting state (position and angle) of the respective constituent elements is adjusted.

In the conventional method, after the adjustment of the printer section of the digital copier, diagnosis was made for the displacement and distortion of the respective constituent elements in the scanner unit 11 and test printing was performed with a test-use chart initially placed by the operator on the document glass 2 and the displacement and distortion of the printed image were checked by the eye of the operator.

According to the present invention, on the other hand, a chart having marks for displacement diagnosis as will be set out below is initially printed on or attached to the scanner unit 11 itself, each mark of the chart is detected through the CCD line sensor 4 and self-diagnosis is made, by the scanner unit 11 itself, from the result of detection, for the displacement or distortion of the respective constituent elements. By doing so, it is possible to make accurate and independent diagnosis, for a shorter time period, for the displacement and distortion of each constituent element of the scanner unit 11, without the need for adjusting the printer section, and to obtain a high reliable result of diagnosis. It is to be noted that, in the following explanation and claims of this invention, the positional displacement, tilt, distortion, etc., of the respective constituent elements of the scanner unit 11 are generally referred to simply as the term "displacement".

Figure 3:
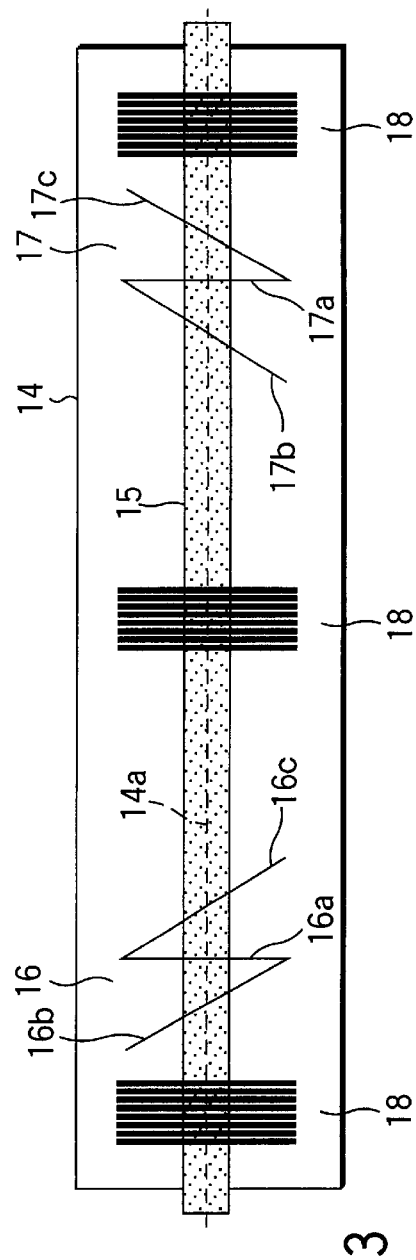
FIG. 3 is a diagrammatic view showing a diagnosis-use chart printed on a document glass of the scanner unit of FIG. 1.
Figure 4:
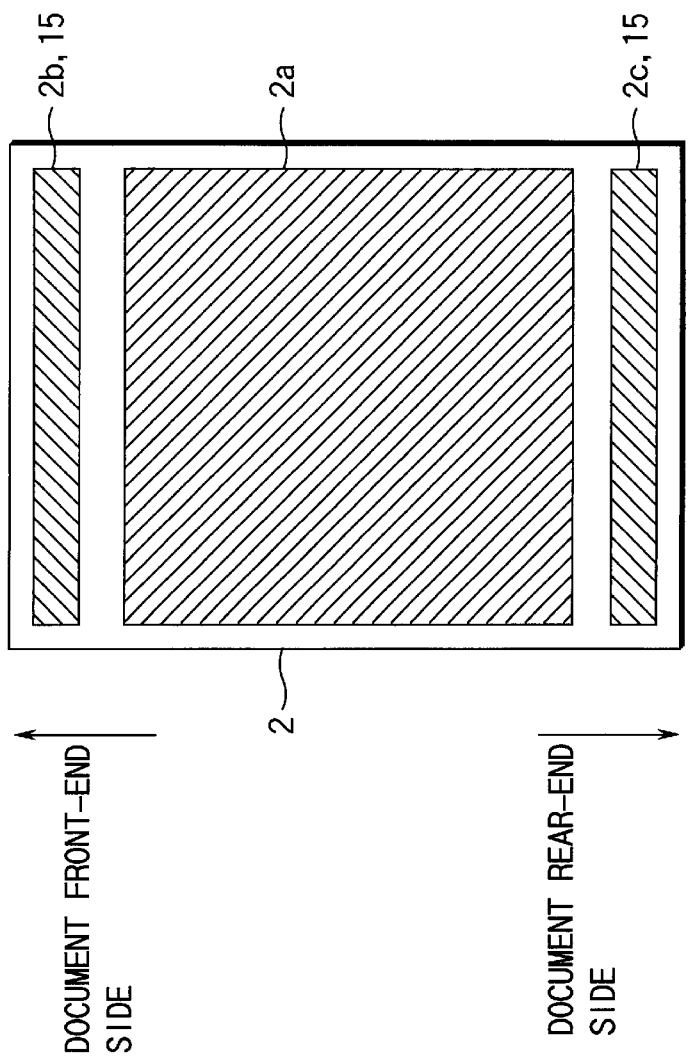
FIG. 4 is a plan view showing a state in which parts of the chart of FIG. 3 is printed at a predetermined place on a document glass.

FIG. 3 shows one example of the chart 14 having a plurality of marks for displacement diagnosis. FIG. 4 is a plan view showing the document glass 2 with a middle section 14 of the chart 15 attached to a predetermined position.

The chart 14 of FIG. 3 is so cut off as to leave a rectangular middle section 15 of about 5 mm in width along its longitudinal direction with a center line 14a. The middle section 15 is attached to both side areas 2b and 2c along the sub-scanning direction of a document effective area 2a on the document glass 2 as shown in FIG. 4. It is to be noted that each middle section 15 is so attached that its center line 14a extends along the main scanning direction. In this embodiment, a distance between the center lines 14a of the middle sections 15 attached to the respective areas 2b and 2c was set to be 435 mm. The portion of the chart 14 so attached to the document glass 2 is not restricted to the above-mentioned middle section 15 and any portion of the chart 14 extending in the main scanning direction will do. And the portion, for example, the middle portion 15, of the chart 14 enhances the parallelism between the respective areas 2b and 2c and that between the area and the document effective area 2a and it is preferably printed directly on the document glass 2.

The chart 14 has N-shaped marks 16, 17 for making diagnosis for the positional displacement, tilt, magnification shift, etc. of image and pair line marks 18 for making diagnosis for a defocus amount. Three pair line marks 18 are provided along the main scanning direction, that is, one for the rear side, one for the center and one for the front side of the scanner unit 11 and the N-shaped marks 16 and 17, each, are provided along the main scanning direction on the rear side and on the front side of the scanner unit 11.

The N-shaped mark 16 (17) has a line segment 16a (17a) extending along the sub-scanning direction and one set of two line segments 16b, 16c (17b, 17c) mutually parallel and oblique to the main scanning direction and sub-scanning direction. The angle between the middle line segment 16a (17a) and the respective side line segments 16b, 16c (17b, 17c) is variable depending upon the detection sensitivity of the CCD line sensor 4 but, if the angle between both is made greater (approximate to 90°), the detection sensitivity is made better. It is to be noted that, in this embodiment, the angle is set to be 45°. And, in this embodiment, the distance between the middlet line segments 16a and 17a of the two N-shaped marks 16 and 17 is set to be 200 mm.

The pair line mark 18 is comprised of a plurality of sets of pair lines along the main scanning direction, each pair lines being formed of a pair of line segments, black and white, extending in the sub-scanning direction and having a given width in the main scanning direction. The width of the pair of black/white lines along the main scanning direction, though being varied in accordance with the resolution of the CCD line sensor 4, was set to be 168 $\mu$m (corresponding to four pixels) in this embodiment. That is, the respective width of the white line and black line was set to be 84 $\mu$m.

Figure 5:
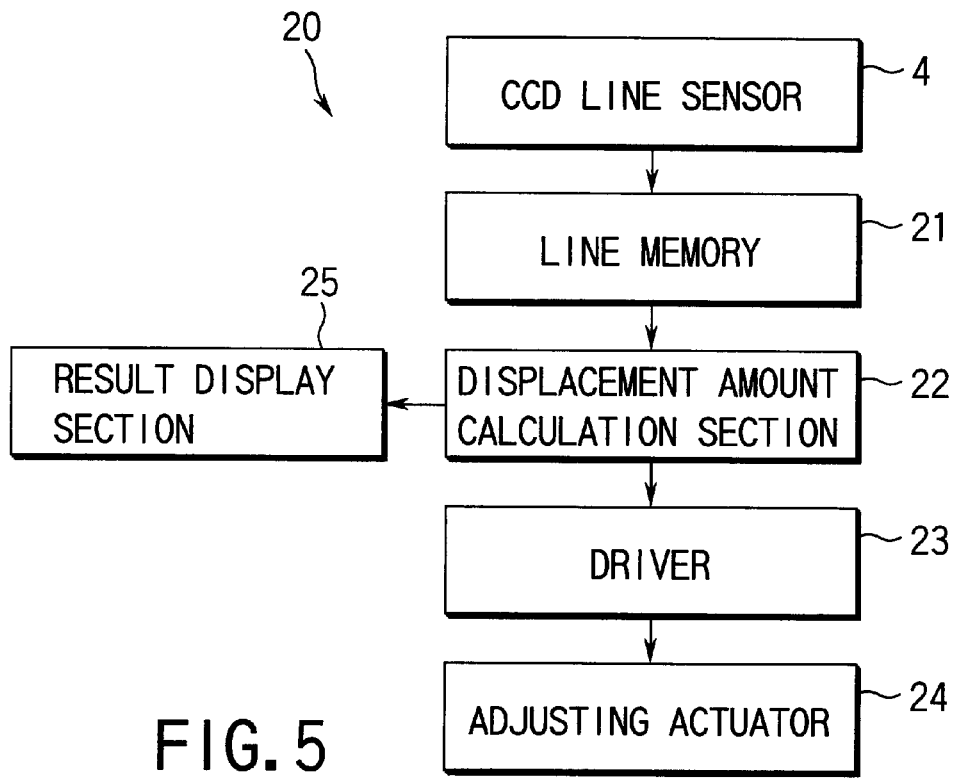
FIG. 5. is a block view showing an adjusting apparatus for adjusting the displacements of respective constituent elements in the scanner unit on the basis of a result of detection obtained by detecting the chart of FIG. 3 by the CCD line sensor of FIG. 2.

With reference to a block diagram of FIG. 5 an explanation will be made below about an adjusting apparatus 20 which, by detecting the middle section 15 of the chart 14 (sometimes referred to simply as the chart 15) by the CCD line sensor 4, makes diagnosis for the displacement of the respective constituent elements of the scanner unit 11 from a result of detection and automatically adjusts the displacement of the respective constituent elements.

The adjusting apparatus 20 has a CCD line sensor 4 for detecting the chart 15, a line memory 21 for allowing line data which is converted to an electric signal from light coming from the CCD line sensor 4 and which corresponds to one scanning line along the main scanning direction to be stored as a result of detection, a displacement amount calculation section 22 for calculating various displacement amounts on the basis of the one scanning line data stored in the line memory 21, an adjusting actuator 24 for automatically adjusting the displacement of each constituent element of the scanner unit 11 in accordance with the displacement amount calculated by the displacement amount calculation section 22, a driver 23 for operating the adjusting actuator 24, and a result display section 25 for displaying information on the displacement of the respective constituent element, such as an operation guide, etc., for the operator, on the basis of a result of calculation by the displacement amount calculation section 22.

In the case where the displacement of the respective constituent elements of the scanner unit 11 is to be adjusted, light is directed through the light source unit 3 onto the chart 15 printed on the document glass 2, its reflected light is conducted via an optical system to the CCD line sensor 4, and the line data corresponding to one line on the center line 14a extending along the main scanning direction of the chart 15 is read out through the CCD line sensor 4. And the one-line data is once stored in the line memory 21, the displacement amount calculation section 22 calculates the later-described various displacement amounts based on the one-line data and delivers them to the driver 23. The driver 23 operates the adjusting actuator 24 in accordance with an output from the displacement amount calculation section 22, so that the displacement of the respective constituent element of the scanner unit 11 is automatically adjusted. Further, a result of calculation at the displacement amount calculation section 22 is displayed in a desired format on the result display section 25.

The result display section 25 displays a message for supporting an adjusting operation of an operator, such as "please turn a rear-side adjusting screw of the second mirror 6 one rotation to the right", etc. That is, if the above-mentioned result of diagnosis reveals that no automatic adjustment of the respective constituent element can be continued and hence manual adjustment is required on the operator side, then the operator will perform the adjusting operation on the basis of a message displayed on the result display section 25.

Now an explanation will be made below about the method for diagnosing the respective constituent of the thus constructed scanner unit 11 for any displacement.

If there arises any displacement in the constituent elements constituting the scanner unit 11, it appears as a positional displacement, tilt, magnification shift, defocus, etc of the read-out image. For this reason, the constituent elements can be diagnosed for the displacement by detecting the displacement of an image obtained upon reading out the above-mentioned chart 15 through the CCD line sensor 4.

First, in an ideal state in which, as a reference for a displacement diagnosis, there is no displacement in all the constituent elements of the scanner units 11, the data of an image corresponding to the center line 14a of the respective charts 15 is detected through the CCD line sensor 4. And the detected positions of the respective line segments 16a, 16b, 16c, 17a, 17b, 17c of the respective N-shaped marks 16, 17 are stored in the displacement amount calculation section 22 as reference value made to correspond to a plurality of photoelectric conversion elements 4a in the CCD line sensor 4.

And upon real displacement diagnosis, the real chart 15 is detected in a position where, in the above-mentioned ideal state, the center line 14a of the chart 15 is detected, and the displacement calculation section 22 compares the real detected positions of respective segment lines 16a, 16b, 16c, 17a, 17b, 17c with initially stored reference values and calculates a displacement amount between both. The calculated displacement amount can be regarded as an image displacement resulting from a displacement of the constituted elements and the displacement amount calculation section 22 converts the calculated displacement amount to an adjusting amount of the constituent element resulting from the displacement and the result display section 25 displays this adjusting amount. And if the constituent element causing the displacement can be automatically adjusted, the displacement amount calculation section 22 outputs this adjusting amount to the driver 23 as an operation amount of the adjusting actuator 24.

In the case where diagnosis is made for the positional displacement of an image along the main scanning direction which is read out by the CCD line sensor 4, the detection position of the line segment 16a extending in the sub-scanning direction of the chart 15 at the area 2b on the document front-end side is compared with its reference value. Supposing that, in this case, the real detection position of the line segment 16a is given as X and the reference value as X0, a displacement amount Z1 of a read-out image along the main scanning direction is given below $$Z1 = (X - X0) \times 0.042 \text{ [mm]}$$

noting that one pixel is 42 μm. It is to be noted that, in place of comparing the detection position of the line segment 16a of one mark 16 with the reference value, the detection position of the segment line 17a of the other mark 17 may be compared with the reference value or the chart 15 attached to the area 2c on the document rear-end side may be utilized.

In the case where diagnosis is made for the positional displacement of a read-out image along the sub-scanning direction, calculation is made, for example, on the distances Wb, Wc between the detection position of the straight line segment 16a of one N-shaped mark 16 of the chart 15 at the area 2b on the document front-end side and the detection positions of the two mutually parallel and oblique line segments 16b, 16c. In this case, in the ideal state, Wb=Wc and, remembering that the angle of the oblique line segments 16b, 16c made with respect to the straight line segment 16a is 45°, the displacement amount Z2 of the read-out image along the sub-scanning direction is given by $$Z2 = (Wb - Wc) \times 0.042 \text{ [mm]}$$

Even in this case, in place of using one N-shaped mark 16, the other N-shaped mark 17 may be used or the chart 15 at the area 2c on the document rear-end side may be utilized.

In the case where diagnosis is made for the tilt of the axis of the read-out image along the main scanning direction, calculation is made, for example, on the distances Wb, Wc between the detection position of the straight line segment 16a of one N-shaped mark 16 of the chart 15 at the area 2b on the document front-end side and the detection position of the two mutually parallel and oblique line segments 16b, 16c to find the difference W1 between both. Further, calculation is made on the distances Wb, Wc between the detection position of the straight line segment 17a of the N-shaped mark 17 at the area 2b on the document front-end side and the detection position of the two mutually parallel and oblique segment lines 17b, 17c to find the difference W2 of both. In this case, the tilt Z3 of the axis of the read-out image along the main scanning direction becomes $$Z3=(W1-W2)\times 0.042/200\times 100\ [\%]$$

because the distance between the two N-shaped marks 16 and 17 is 200 mm. It is to be noted that, in this case, the N-shaped marks 16, 17 of the chart 15 at the area 2c on the document rear-end side may be used in place of using the N-shaped marks 16, 17 of the chart 15 at the area 2b on the document front-end side.

Further, in the case where diagnosis is made for the tilt of the axis of the read-out image along the sub-scanning direction, comparison is made for example, in a positional relation along the main scanning direction between the detection position X1 of the straight line segment 16a of the N-shaped mark 16 at the area 2b on the document front-end side and the detection position X2 of the straight line segment 16a of the N-shaped mark 16 at the area 2c on the document rear-end side. Since, in this case, the tilt Z4 of the axis of the read-out image along the sub-scanning direction becomes $$Z4=(X1-X2)\times 0.042/435\times 100\ [\%]$$

noting that the distance between the chart 15 at the area 2b on the document front-end side and the chart 15 at the area 2c on the document rear-end side is 435 mm. It is to be noted that, in this case, comparison may be made between the detection position of the line segment 17a of the N-shaped mark 17 at the area 2b on the document front-end side and the detection position of the line segment 17a of the N-shaped mark 17 at the area 2c on the document rear-end side in place of comparing the detection position of the line segment 16a at the area 2b on the document front-end side with the detection position of the line segment 16a at the area 2c on the document rear-end side.

In the case where diagnosis is made for the magnification shift of the rear-out image along the main scanning direction, calculation is made, for example, on the distance W between the detection positions of the straight segments 16a and 17a of the two N-shaped marks 16 and 17 of the chart 15 at the area 2b on the document front-end side and comparison is made between it and its reference value, that is, a distance W0 between the two marks 16 and 17. In this case, the magnification shift Z5 of the read-out image along the main scanning direction is given by $$Z5=(W-W0)\times 0.042/200\times 100\ [\%]$$

It is to be noted that, even in this case, the chart 15 at the area 2c on the document rear-end side may be used in place of using the chart 15 at the area 2b on the document front-end side.

In the case where diagnosis is made for the magnification shift of the read-out image along the sub-scanning direction, calculation is made, for example, on the distances Wb, Wc between the detection position of the straight line segment 16a of the N-shaped mark 16 of the chart 15 at the area 2b on the document front-end side and the detection positions of the two mutually parallel and oblique line segments 16b, 16c to find the difference W1 between both. And calculation is made on the distances Wb, Wc between the detection position of the straight line segment 16a of one N-shaped mark 16 of the chart 15 on the area 2c on the document rear-end side and the detection positions of the two mutually parallel and oblique line segments 16b, 16c to find the difference W2 between both. Since, in this case, the angle of the oblique line segments 16b, 16c made with respect to the straight line segment 16a is 45° and the distance between the respective charts 15 at the areas 2b and 2c is 435 mm, the magnification shift Z6 of the read-out image along the sub-scanning direction becomes $$Z6=(W1-W2)\times 0.042/435\times 100\ [\%]$$

It is to be noted that, even in this case, instead of using the N-shaped mark 16 at the respective areas 2b and 2c, the other N-shaped mark 17 at the respective areas 2b and 2c may be used.

In the case where diagnosis is made for the defocus of a read-out image, six pair line marks 18 in total at the rear, center and front side of the chart 15 at the area 2b on the document front-end side and at the rear, center and front side of the chart 15 at the area 2c at the document rear-end side are detected through the CCD line sensor 4. In the case where the respective pair line marks 18 are to be detected, calculation is made on the difference between the read-out concentration Wn of an n-th white line and the read-out concentration Bn of an n-th black line and calculation is made on the mean concentration difference of all the pair lines and MTF characteristic at each mark 18. Supposing that each mark 18 has 80 sets of the pair lines, the concentration difference Z7 and MTF characteristic Z8 become:

$$Z7=\Sigma(Bn-Wn)/80$$

$$Z8=\Sigma(Bn-Wn)/(Bn+Wn))\times 100/80\ [\%]$$

By comparing the concentration difference Z7 and MTF characteristic Z8 with reference values and comparing them between the respective pair line marks 18, defocus diagnosis can be made at six places in total at the front, center and rear side at the front end side and at the front, center and rear side at the rear end side of the scanner unit 11.

According to the present invention, as set out below, calculation can be automatically made on the read-out image main scanning direction position displacement, sub-scanning direction position displacement, tilt of the axis along the main scanning direction, tilt of the axis along the sub-scanning direction, magnification shift along the main scanning direction, magnification shift along the sub-scanning direction and defocus by detecting, via the CCD line sensor 4, the chart 15 as shown in FIG. 3 which is attached to the document glass 2. And self-diagnosis can be made for the displacement of the respective constituent elements of the scanner unit 11 on the basis of the displacement of the calculated read-out image. Therefore, accurate diagnosis can be made, for a shorter time period, for the displacement of the respective constituent element in the scanner unit 11 and it is possible to obtain a high reliable result of diagnosis.

Then another embodiment of this invention will be explained below.

A scanner unit of this embodiment has a mechanism for driving a lens 8 and CCD line sensor 4 along an optical axis. It is, therefore, possible to change a front-side optical path length between the document and the lens 8 and a rear-side optical path length between the lens 8 and the CCD line sensor 4 and optically change an image formation magnification to the CCD line sensor 4.

In connection with this scanner unit an explanation will be made about the method by which diagnosis is made for the defocus of an image for each image formation magnification. It is to be noted that the scanner unit of this embodiment has the same arrangement as that of the above-mentioned embodiment except that it has the mechanism for moving the lens 8 and CCD line sensor 4 along the sub-scanning direction.

Figure 6:
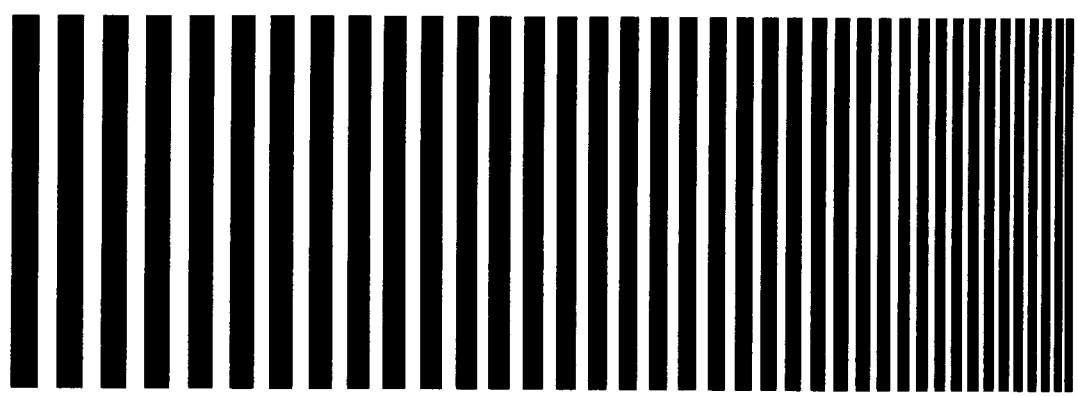
FIG. 6 is a view showing a pair line mark used in another embodiment of this invention.

In the scanner unit capable of driving the lens 8 and CCD line sensor 4, the resolution at a reading-out time varies depending upon its magnification. In the scanner unit of this embodiment having a resolution of 600 dpi at a time of a 100% magnification, for example, the resolution is changed to 1200 dpi at a time of a magnification to 200%. Since, in this embodiment, an automatic defocus diagnosis is made in accordance with a change in resolution, a pair line mark 31 as shown in FIG. 6 was prepared in place of the above-mentioned pair line mark 18.

This pair line mark 31 has a plurality of sets of black/white pair lines extending in the sub-scanning direction and varying in width along a main scanning direction.

In the case where defocus diagnosis is made at each magnification, calculation is made on the concentration difference, or MTF characteristic, having a width matched to the magnification corresponding to a position along the sub-scanning direction of the lens 8 and CCD line sensor 4 with the use of the above-mentioned method and diagnosis is made for the defocus at the magnification involved. For example, if the lens 8 and CCD line sensor 4 are moved to be matched to 200% magnification, since use is made of the black/white pair lines of a 168 $\mu$m width at a 100% magnification time (600 dpi), calculation is made on the concentration difference or MTF characteristic of the pair lines of a 84 $\mu$m width.

That is, the CCD line sensor 4 is gradually moved to vary the magnification and, each time, calculation is made on the concentration difference, or MTF characteristic, of the pair lines having a width corresponding to the magnification to make defocus diagnosis at each magnification. Such diagnosis is repeated to find a maximal value of the concentration difference or MTF characteristic or to find the concentration difference, or MTF characteristic, equal to or greater than a predetermined value, so that a focus state may be improved.

Figure 7:
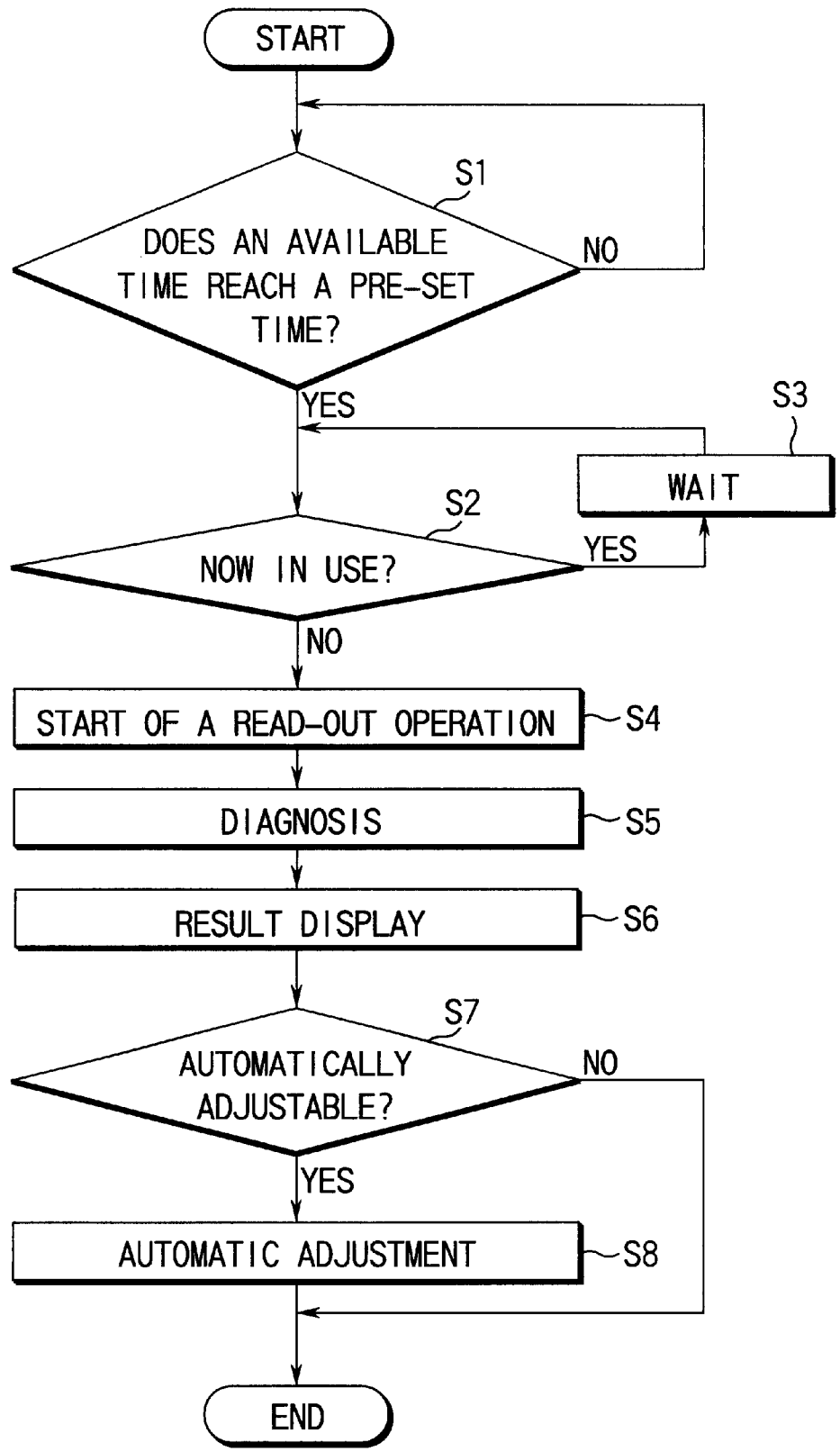
FIG. 7 is a flow chart for explaining a method by which the scanner unit per se makes routine self-diagnosis for the displacements of respective constituent elements in the scanner unit.

With reference to a flow chart in FIG. 7, an explanation-!will be made below about the method by which the scanner unit itself makes periodic self-diagnosis for the displacement of its respective constituent elements and, based on the result of this diagnosis, their displacements are automatically adjusted.

First, a controller, not shown, of the scanner unit 11 obtains an available time of a digital copier managed under a CPU, not shown, of a system section for controlling the copier as a whole. And at a point of time in which the available time obtained by the controller reaches a pre-set time (step 1: YES), it is decided whether or not the digital copier is now in use (step 2). If, at a result of decision at step 2, it is decided that the digital copier is now in use (step 2: YES), a wait is made for a predetermined time interval only (step 3) and then a reconfirmation is made as to whether or not the digital copier is now in use (step 2).

If, as a result of decision at step 2, the controller, not shown, of the scanner unit 11 decides that the digital copier is not in use (step 2: NO), the scanner unit 11 itself starts to run an initially prepared program for making routine displacement diagnosis. And an automatic diagnosis mode is entered for self-diagnosing respective constituent elements in the scanner unit 11.

At the: entry of the automatic diagnosis mode, a read-out operation is made via the CCD line sensor 4 to read out the chart 15 attached to the document glass 2 along its center line 14*a* (step 4). Calculation is made by the displacement amount calculation section 22 on various kinds of displacement amounts of a read-out image (step S5) and a result of diagnosis is displayed on the result display section 25 (step S6).

At this time, based on the result of diagnosis at step S5, the controller decides whether or not the constituent elements displaced can be automatically adjusted (step S7). So long as, as a result of decision, the displaced constituent elements are automatically adjustable (step S7: YES), the controller automatically adjust the values of respective kinds of registers which correct the displacements of the involved constituent elements (step S8). And the adjusting actuator 24 is operated to automatically correct the:displacement of the involved constituent elements.

Figure 8:
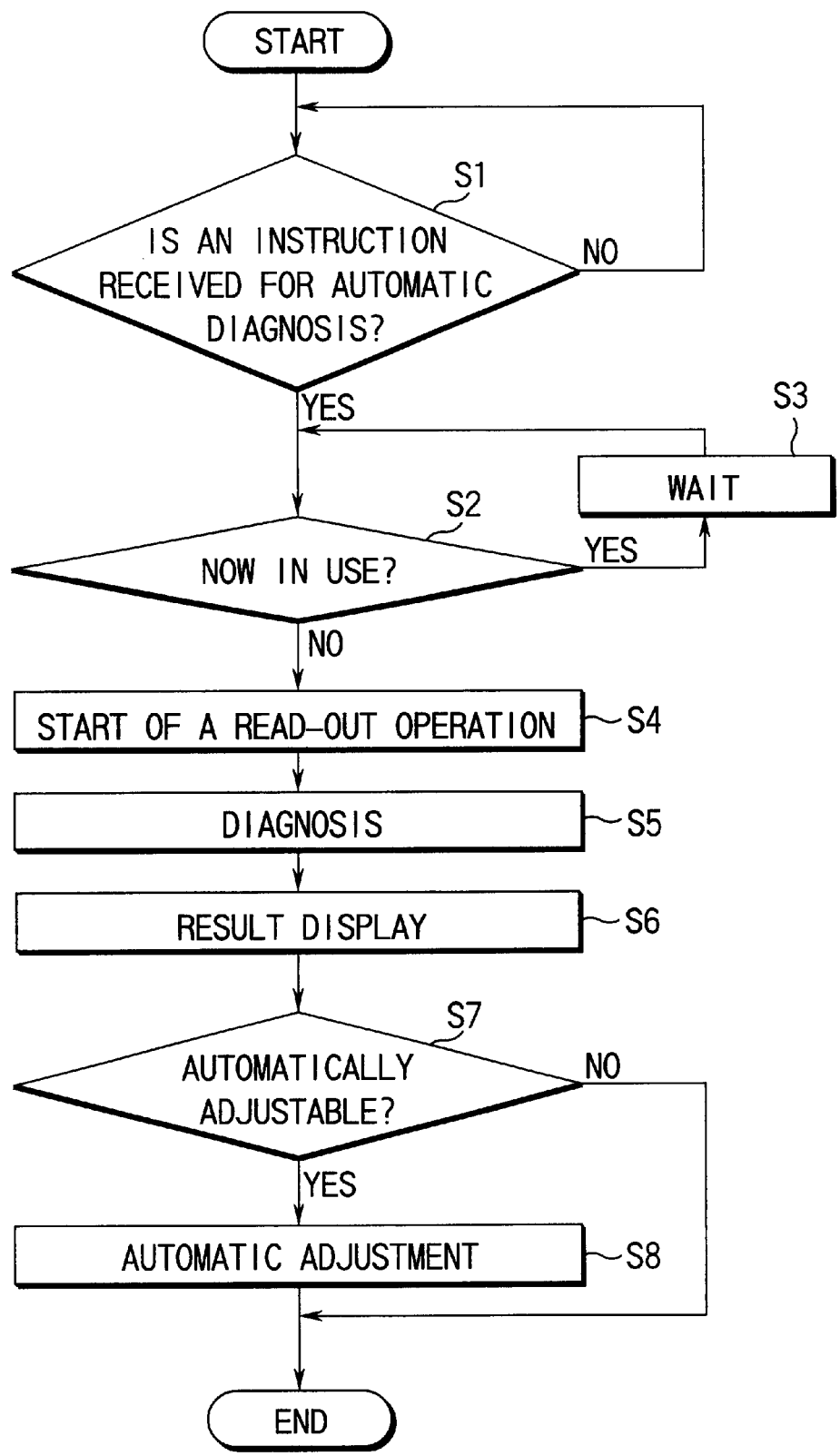
FIG. 8 is a flow chart for explaining a method by which, through an operation from a remote site, the scanner unit per se makes self-diagnosis for the displacement of respective constituent elements in the scanner unit.

Then with reference to the flow chart of FIG. 8 an explanation will be made below about the method by which self-diagnosis is made for the displacement of respective constituent elements of the scanner unit 11 by an operation from a remote site and, based on a result of diagnosis, the displacement of the constituent elements is automatically adjusted.

First, via a telephone circuit line, network, etc., an instruction relating to the execution of an automatic diagnosis is transmitted through a CPU of a system section of a digital copier to a controller, not shown, of the scanner unit 11 (step S1). When the controller of the scanner unit 11 receives the instruction (step S1: YES), the controller decides whether or not the digital copier is now in use (step S2). If, at a result of decision at step S2, it is decided that the digital copier is now in use (step S2: YES) and a wait is made for a predetermined time only (step S3). And a reconfirmation is made as to whether or not the digital copier is now in use (step S2).

As a result of the decision at step S2, if the controller, not shown, of the scanner unit 11 decides that the digital copier is not now in use (step S2: NO), the scanner unit 11 itself starts to run an initially prepared program for making routine displacement diagnosis and an automatic diagnosis mode is entered to self-diagnose respective constituent elements in the scanner unit 11.

At the entry of the self-diagnosis mode, a read-out operation is made via the CCD line sensor 4 to read out a chart 15 attached to the document glass 2 along its center line 14*a* (step S4), calculation is made by the displacement amount calculation section 22 on various kinds of displacement amounts of a read-out image to make diagnosis for the displacement of the respective constituent element (step S5) and a result of diagnosis is displayed on a result display section 25 (step S6).

At this time, based on the result of diagnosis at step S5, the controller decides whether or not the constituent elements displaced can be automatically adjusted (step S7). So long as, as a result of this decision, the displaced constituent elements are automatically adjustable (step S7: YES), the controller automatically adjusts the values of various kinds of registers which automatically correct the displacements of the involved constituent elements (step S8). And the adjusting actuator 24 is operated, thus automatically corrects the displacements of the involved constituent elements.

It is to be noted that this invention is not restricted to the above-mentioned embodiments and can be variously modified within the spirit and scope of this invention. Although, in the above-mentioned embodiments,. an explanation is made about the method by which diagnosis is made for the displacements of the constituent elements in a manner to attach the chart 15 (see FIG. 3), to the document glass, this invention is not limited thereto. The chart 15 may be attached adjacent to a white paper sheet, not shown, of the shading plate 12 and it can be set to any proper position.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A displacement diagnosing method applied to an image read-out apparatus having a light source for illuminating a document, an optical element for allowing light which is reflected on the document to be received and detecting a corresponding image signal and a plurality of optical members for guiding the reflected light from the document to the optical element, the method comprising the steps of:

directing light from the light source to a mark provided on a body of the image read-out apparatus in a position adjacent to the document;

guiding the corresponding reflected light to the optical element through the optical members to allow an image signal relating to the mark to be detected by the optical element;

making diagnosis, based on the detected image signal, for displacements of constituent elements of the read-out apparatus including the light source, optical members and optical element; and displaying a result of diagnosis.

2. A displacement diagnosing method applied to an image read-out apparatus having a light source for illuminating a document, an optical element for allowing light which is reflected from the document to be received and detecting a corresponding image signal and a plurality of optical members for guiding the reflected light from the document to the optical element, the method using a diagnosis chart provided on a body of the image read-out apparatus in a position adjacent to the document and including a first mark having a line segment extending in a first direction along the document and line segments oblique to the first direction and a second mask having a plurality of sets of black/white pair lines extending in the first direction and arranged along a second direction perpendicular to the first direction and using a plurality of photoelectric conversion elements provided at the optical element and arranged along the second direction and comprising the steps of:

directing the light from the light source to the chart;

guiding the reflected light through the optical members to the photoelectric conversion elements in the optical elements to detect an image signal relating to the first and second marks; and making diagnosis, based on the detected image signal, for displacements of constituent elements of the image read-out apparatus including the light source, optical members and optical element.

3. A method according to claim 2, wherein the image read-out apparatus has a document glass on which a document is placed and the chart is provided in a position away from an area at which the document is set on the document glass and extends along the second direction.

4. A method according to claim 3, wherein, in place of the chart, two such charts are provided in a spaced-apart relation along the first direction and in those positions away from those areas at which the document is set on the document glass.

5. A method according to claim 2, wherein the image read-out apparatus has a reference plate arranged adjacent to the document to provide a detection reference by the optical element and extending along the second direction and the chart is provided on the reference plate.

6. A method according to claim 2, further comprising the step of displaying a result of diagnosis.

7. A method according to claim 2, wherein the image read-out apparatus has such a structure as to enable a light reception power to be made variable by the optical element and the pair lines of the second mark have widths gradually-varied in the second direction in accordance with the light reception power and calculation is made on at least one of a concentration difference and MTF characteristic of those of the pair lines of the second mark detected through the optical element which have a width corresponding to the light reception power and defocus diagnosis is made from a result of calculation.

8. A displacement diagnosing/adjusting method applied to an image read-out apparatus having a light source for illuminating a document, an optical element for allowing light which is reflected on the document to be received and detecting a corresponding image signal and a plurality of optical members for guiding the reflected light from the document to the optical element, the method comprising the steps of:

directing light from the light source onto a mark provided on a body of the image read-out apparatus in a position adjacent to the document;

guiding the reflected light to the optical element through the optical members to the optical element to detect an image signal relating to the mark;

making self-diagnosis, by the image read-out apparatus, based on the detected image signal, for the displacements of constituent elements of the read-out apparatus including the light source, optical members and optical element;

automatically adjusting the displacements of the constituent elements involved as a result of self-diagnosis; and displaying a result of self-diagnosis.

\* \* \* \* \*